US012777784B2

(12) United States Patent
Park et al.

(10) Patent No.: US 12,777,784 B2
(45) Date of Patent: Oct. 27, 2026

(54) DISPLAY APPARATUS

(71) Applicant: Samsung Display Co., Ltd., Yongin-Si (KR)

(72) Inventors: Jeongju Park, Yongin-si (KR); Donghan Kang, Yongin-si (KR); Sunggwon Moon, Yongin-si (KR); Seungsok Son, Yongin-si (KR); Shinhyuk Yang, Yongin-si (KR); Kapsoo Yoon, Yongin-si (KR); Keumhee Lee, Yongin-si (KR); Woogeun Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 457 days.

(21) Appl. No.: 18/215,832

(22) Filed: Jun. 29, 2023

(65) Prior Publication Data

US 2024/0138207 A1 Apr. 25, 2024
US 2024/0237427 A9 Jul. 11, 2024

(30) Foreign Application Priority Data

Oct. 21, 2022 (KR) ........................ 10-2022-0136828

(51) Int. Cl.
*H10K 59/124* (2023.01)

(52) U.S. Cl.
CPC .................................. *H10K 59/124* (2023.02)

(58) Field of Classification Search
CPC ............................. H10K 59/00; H10K 59/124
See application file for complete search history.

(56) References Cited

U.S. PATENT DOCUMENTS 8,268,194 B2 9/2012 Kim et al.
8,389,344 B2 3/2013 Jung et al.
8,450,732 B2 5/2013 Kim et al.
8,766,265 B2 7/2014 Lee et al.
9,548,321 B2 1/2017 Lee et al.
2009/0159879 A1 * 6/2009 Jeong ................. H10D 30/6755 257/E33.013
2009/0212295 A1 8/2009 Jeong et al.
2010/0271582 A1 10/2010 Gotoh et al.
2011/0206590 A1 * 8/2011 Honda .................. C23C 16/308 118/723 AN
2012/0153285 A1 6/2012 Mueller et al.
2016/0260915 A1 9/2016 Lee et al.
2018/0197819 A1 * 7/2018 Zhang ............... H10W 20/0698
2019/0067627 A1 * 2/2019 Jia .......................... H10K 50/15
(Continued)

FOREIGN PATENT DOCUMENTS

CN 114628414 A 6/2022
KR 10-2012-0093194 A 8/2012
(Continued)

*Primary Examiner* — Vongsavanh Sengdara
(74) *Attorney, Agent, or Firm* — Innovation Counsel LLP

(57) ABSTRACT

A display apparatus is disclosed that includes a thin-film transistor including a semiconductor layer, an organic light-emitting element, and a passivation layer including a first contact hole connecting the thin-film transistor and the organic light-emitting element, wherein the passivation layer includes a first passivation layer, a second passivation layer, and a third passivation layer, which are sequentially stacked, and the first passivation layer includes SiON.

24 Claims, 8 Drawing Sheets

(56) References Cited

U.S. PATENT DOCUMENTS

| | | | | |
|---|---|---|---|---|
| 2021/0028272 | A1 | 1/2021 | Kim et al. | |
| 2021/0072603 | A1* | 3/2021 | Tomioka | G02F 1/133345 |
| 2022/0069042 | A1* | 3/2022 | Jung | H10K 59/1201 |
| 2022/0209188 | A1 | 6/2022 | Wu et al. | |
| 2023/0077299 | A1* | 3/2023 | Lee | H10K 59/1315 |
| 2023/0403891 | A1* | 12/2023 | Ryu | H10D 30/6729 |

FOREIGN PATENT DOCUMENTS

| | | | |
|---|---|---|---|
| KR | 10-1509663 | B1 | 4/2015 |
| KR | 10-1510212 | B1 | 4/2015 |
| KR | 10-1519480 | B1 | 5/2015 |
| KR | 10-1837625 | B1 | 3/2018 |
| KR | 10-1833235 | B1 | 4/2018 |
| KR | 10-2019-0002888 | A | 1/2019 |
| KR | 10-2021-0012100 | A | 2/2021 |
| KR | 10-2021-0143951 | A | 11/2021 |

* cited by examiner

FIG. 8

Table 1

| Experimental example | First passivation layer | | Second passivation layer | | Third passivation layer | | Lifting defect/glass |
|---|---|---|---|---|---|---|---|
| | Composition | Thickness | Composition | Thickness | Composition | Thickness | |
| Comparative Example 1 | – | | SiNx | 2000 Å | SiNx | 3000 Å | 19.50/glass |
| Comparative Example 2 | SiNx | 500 Å | SiNx | 1500 Å | SiNx | 3000 Å | 5.80/glass |
| Embodiment 1 | SiON | 300 Å | SiNx | 1700 Å | SiNx | 3000 Å | 0.60/glass |
| Embodiment 2 | SiON | 500 Å | SiNx | 1500 Å | SiNx | 3000 Å | 0.02/glass |
| Embodiment 3 | SiON | 1000 Å | SiNx | 1000 Å | SiNx | 3000 Å | 0.00/glass |

DISPLAY APPARATUS

CROSS-REFERENCE TO RELATED APPLICATION

This application is based on and claims priority under 35 U.S.C. § 119 to Korean Patent Application No. 10-2022-0136828, filed on Oct. 21, 2022, in the Korean Intellectual Property Office, the disclosure of which is incorporated by reference herein in its entirety.

BACKGROUND

1. Field

The present disclosure relates to the structure of a display apparatus.

2. Description of the Related Art

Display apparatuses visually display data. A display apparatus may include a substrate that includes a display area and a peripheral area. In the display area, scan lines and data lines are insulated from each other, and a plurality of pixels are arranged. Furthermore, in the display area, a thin-film transistor and a pixel electrode electrically connected to the thin-film transistor may be provided in correspondence with each of the pixels. Furthermore, in the display area, a counter electrode may be commonly provided to the pixels. In the peripheral area, various signal lines for transmitting electrical signals to the display area, a scan driver, a data driver, a controller, a pad portion, and the like may be provided.

The use of such display apparatuses has diversified. Accordingly, designs for improving the quality of display apparatuses have been made in various ways.

SUMMARY

One or more embodiments may provide a display apparatus which may implement an image of excellent quality by preventing layer lifting and layer delamination defects and improving step coverage. However, the scope of the present disclosure is not limited thereby.

Additional aspects will be set forth in part in the description which follows and, in part, will be apparent from the description, or may be learned by practice of the presented embodiments of the disclosure.

An embodiment of a display apparatus may include a semiconductor layer includes a thin film transistor including a semiconductor layer, a gate electrode, and an electrode, an organic light-emitting element electrically connected to the thin film transistor and including a first electrode, an emission layer, and a second electrode, and a passivation layer covering the electrode of the thin film transistor and including a first contact hole connecting the electrode with the first electrode, wherein the semiconductor layer includes a channel region, and a source region and a drain region on both sides of the channel region, the gate electrode overlaps the channel region, and the electrode is electrically connected to the source region or the drain region, the passivation layer includes a first passivation layer, a second passivation layer, and a third passivation layer which are sequentially stacked, the first passivation layer includes SiON, and a first angle formed between a side surface of the first passivation layer facing the first contact hole and a lower surface of the passivation layer is less than each of a second angle formed between a side surface of the second passivation layer facing the first contact hole and the lower surface of the passivation layer and a third angle formed between a side surface of the third passivation layer facing the first contact hole and the lower surface of the passivation layer.

In an embodiment, each of the second passivation layer and the third passivation layer may include SiNx.

In an embodiment, the first angle may be about 200 to about 30°, the second angle may be about 500 to about 60°, and the third angle may be about 400 to about 50°.

In an embodiment, a lower surface of the first passivation layer may protrude toward a center of the first contact hole further than a lower surface of the second passivation layer and a lower surface of the third passivation layer do.

In an embodiment, the length of the lower surface of the first passivation layer protruding toward the center of the first contact hole further than the lower surface of the second passivation layer may be about 0.1 μm to about 0.2 μm.

In an embodiment, the thickness of the first passivation layer may be about 0.10 to about 0.25 times the sum of the thickness of the second passivation layer and the thickness of the third passivation layer.

In an embodiment, the thickness of the first passivation layer may be about 300 Å to about 1000 Å, and the thickness of the second passivation layer may be about 1000 Å to about 1700 Å.

In an embodiment, a ratio of oxygen (O) to silicon (Si) included in the first passivation layer may be about 1.6:1 to about 1.8:1.

In an embodiment, an amount of hydrogen included in the passivation layer, as is detected by secondary ion mass spectrometry (SIMS), may be about $1.0\times10^{21}$ atoms/$cm^3$ to about $2.5\times10^{21}$ atoms/$cm^3$.

In an embodiment, the passivation layer may have a hydrogen ($H_2$) emission amount of about $3.0\times10^{19}$ ea/$cm^2$ to about $7.5\times10^{19}$ ea/$cm^2$, and an ammonia ($NH_3$) emission amount of about $3.5\times10^{20}$ ea/$cm^2$ to about $10.0\times10^{20}$ ea/$cm^2$, as measured by thermal desorption spectroscopy (TDS).

In an embodiment, a compressive stress of the first passivation layer may be less than a compressive stress of the second passivation layer and compressive stress of the third passivation layer.

In an embodiment, the compressive stress of the first passivation layer may be about −40 Mpa to about −52 Mpa, the compressive stress of the second passivation layer may be about −270 Mpa to about −340 Mpa, and the compressive stress of the third passivation layer may be about −130 Mpa to about −170 Mpa.

An embodiment of a display apparatus may include a substrate, a buffer layer disposed on the substrate, an active layer disposed on the buffer layer, a gate insulating layer disposed on the active layer, a gate electrode disposed on the gate insulating layer, an interlayer insulating layer disposed on the gate electrode, an electrode disposed on the interlayer insulating layer and electrically connected to the active layer, and a passivation layer disposed on the electrode, wherein the passivation layer may include a first passivation layer, a second passivation layer, and a third passivation layer, the first passivation layer may include a material consisting of essentially a silicon element and two or more different elements, and each of the second passivation layer and the third passivation layer may include a material consisting of essentially a silicon element and one or more different elements, and the first passivation layer has the compressive stress than the second passivation layer and the third passivation layer.

In an embodiment, the first passivation layer may include SiON, and each of the second passivation layer and the third passivation layer may include SiNx.

In an embodiment, compressive stress of the first passivation layer may be about −40 Mpa to about −52 Mpa, compressive stress of the second passivation layer may be about −270 Mpa to about −340 Mpa, and compressive stress of the third passivation layer may be about −130 Mpa to about −170 Mpa.

In an embodiment, the display apparatus may further include a planarization layer disposed on the passivation layer, and an organic light-emitting element disposed on the planarization layer and including a first electrode, an emission layer, and a second electrode, wherein the passivation layer and the planarization layer may include a first contact hole that connects the first electrode with the electrode, and a first angle formed between a side surface of the first passivation layer facing the first contact hole and a lower surface of the passivation layer may be less than each of a second angle formed between a side surface of the second passivation layer facing the first contact hole and the lower surface of the passivation layer and a third angle formed between a side surface of the third passivation layer facing the first contact hole and the lower surface of the passivation layer.

In an embodiment, the first angle may be about 20° to about 30°, the second angle may be about 50° to about 60°, and the third angle may be about 40° to about 50°.

In an embodiment, a lower surface of the first passivation layer may protrude toward a center of the first contact hole further than a lower surface of the second passivation layer and a lower surface of the third passivation layer do.

In an embodiment, the length of the lower surface of the first passivation layer protruding toward the center of the first contact hole further than the lower surface of the second passivation layer may be about 0.1 μm to about 0.2 μm.

In an embodiment, the thickness of the first passivation layer may be about 0.10 to about 0.25 times a sum of the thickness of the second passivation layer and the thickness of the third passivation layer.

In an embodiment, the thickness of the first passivation layer may be about 300 Å to about 1000 Å, and the thickness of the second passivation layer may be about 1000 Å to about 1700 Å.

In an embodiment, a ratio of oxygen (O) to silicon (Si) included in the first passivation layer may be about 1.6:1 to about 1.8:1.

In an embodiment, an amount of hydrogen included in the passivation layer, as is detected by secondary ion mass spectrometry (SIMS), may be about $1.0\times10^{21}$ atoms/cm$^3$ to about $2.5\times10^{21}$ atoms/cm$^3$.

In an embodiment, the passivation layer may have a hydrogen ($H_2$) emission amount of about $3.0\times10^{19}$ ea/cm$^2$ to about $7.5\times10^{19}$ ea/cm$^2$, and an ammonia ($NH_3$) emission amount of about $3.5\times10^{21}$ ea/cm$^2$ to about $10.0\times10^{20}$ ea/cm$^2$, as measured by thermal desorption spectroscopy (TDS).

BRIEF DESCRIPTION OF THE DRAWINGS

The above and other aspects, features, and advantages of certain embodiments of the disclosure will be more apparent from the following description taken in conjunction with the accompanying drawings, in which:

FIG. 8 is a table providing lifting defect test results.

DETAILED DESCRIPTION

Figure 1:
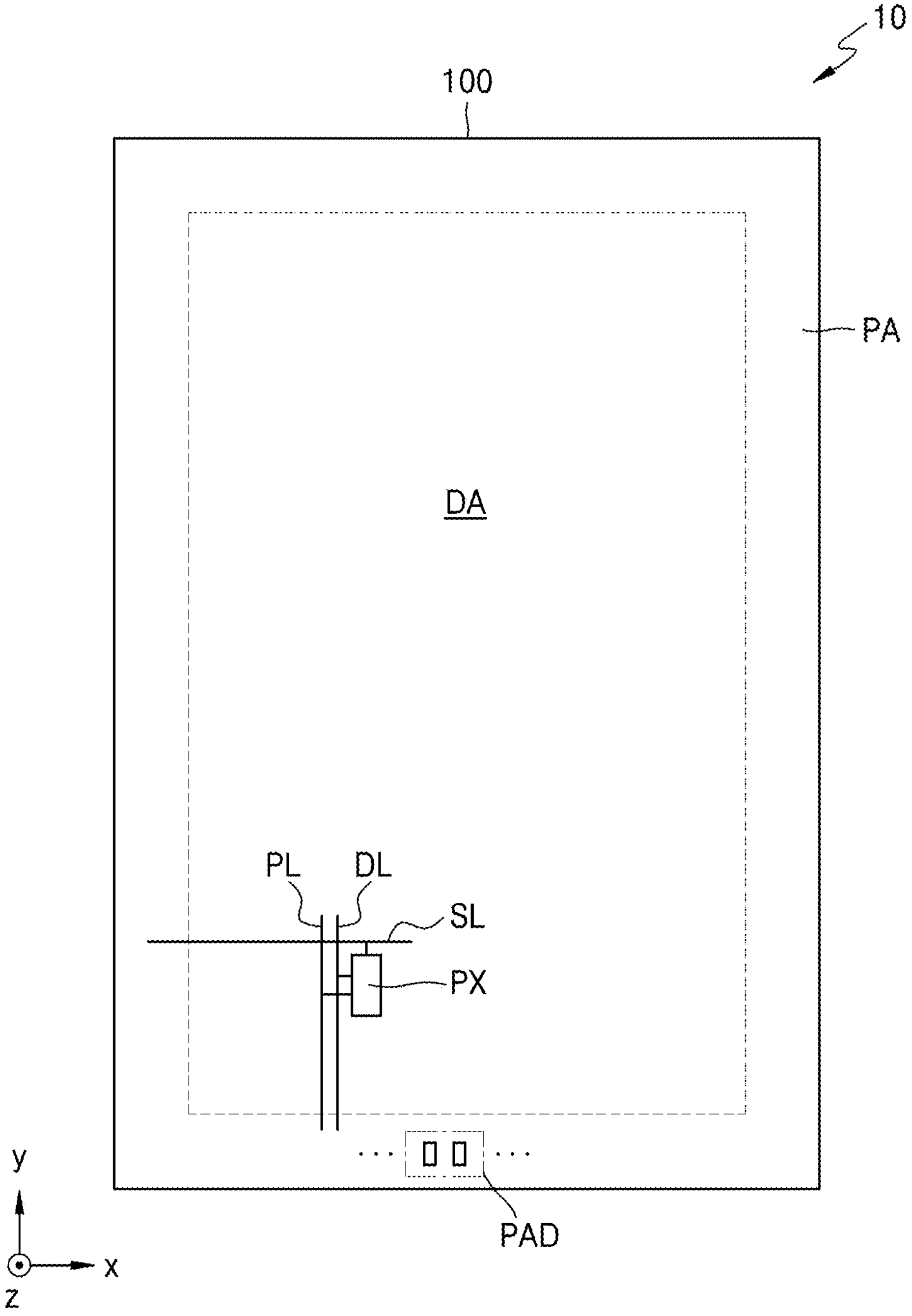
FIG. 1 is a schematic plan view of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

As used herein, the word "or" means logical "or" so that, unless the context indicates otherwise, the expression "A, B, or C" means "A and B and C," "A and B but not C," "A and C but not B," "B and C but not A," "A but not B and not C," "B but not A and not C," and "C but not A and not B." Throughout the disclosure, the expression "at least one of a, b or c" indicates only a, only b, only c, both a and b, both a and c, both b and c, all of a, b, and c, or variations thereof.

Various modifications may be applied to the present embodiments, and particular embodiments will be illustrated in the drawings and described in the detailed description section. The effect and features of the present embodiments, and a method to achieve the same, will be clearer referring to the detailed descriptions below with the drawings. However, the present embodiments may be implemented in various forms, not by being limited to the embodiments presented below.

Hereinafter, embodiments will be described in detail with reference to the accompanying drawings, and in the description with reference to the drawings, the same or corresponding constituents are indicated by the same reference numerals and redundant descriptions thereof are omitted.

In the following embodiment, it will be understood that although the terms "first," "second," etc. may be used herein to describe various components, these components should not be limited by these terms. These terms are only used to distinguish one component from another.

In the following embodiment, the expression of singularity in the specification includes the expression of plurality unless clearly specified otherwise in context.

In the following embodiment, it will be further understood that the terms "comprises," "comprising," "includes," and "including" used herein specify the presence of stated features or components, but do not preclude the presence or addition of one or more other features or components.

In the following embodiments, it will be understood that when a layer, region, or component is referred to as being "formed on" another layer, region, or component, it can be directly or indirectly formed on the other layer, region, or component. That is, for example, intervening layers, regions, or components may be present.

Sizes of components in the drawings may be exaggerated for convenience of explanation. For example, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

In the following embodiments, it will be understood that when a layer, region, or component is referred to as being "connected to" another layer, region, or component, it can be directly connected to the other layer, region, or component or indirectly connected to the other layer, region, or component via intervening layers, regions, or components. For example, in the specification, when a layer, region, or component is referred to as being electrically connected to another layer, region, or component, it can be directly electrically connected to the other layer, region, or component or indirectly electrically connected to the other layer, region, or component via intervening layers, regions, or components.

FIG. 1 is a schematic plan view of a display apparatus according to an embodiment.

As illustrated in FIG. 1, a display apparatus according to the present embodiment may include a display panel 10. The display apparatus may be one of various devices, such as a smartphone, a tablet, a laptop, a television, a billboard, or the like.

The display panel 10 may include a display area DA and a peripheral area PA located outside the display area DA. FIG. 1 illustrates that the display area DA has a rectangular shape. However, the disclosure is not limited thereto. The display area DA may have various shapes, for example, a circular shape, an oval shape, a polygonal shape, a specific shape, and the like. As the display panel 10 includes a substrate 100, it may be said that the substrate 100 includes the display area DA and the peripheral area PA.

The display area DA is a portion that displays an image, and a plurality of pixels PX may be disposed therein. Each pixel PX may include a display element such as an organic light-emitting diode. Each pixel PX may emit, for example, red, green, or blue light. The pixel PX may be connected to a pixel circuit including a thin film transistor, a storage capacitor, and the like. The pixel circuit may be connected to a scan line SL for transmitting a scan signal, a data line DL for transmitting a data signal and crossing the scan line SL, a driving voltage line PL for supplying a driving voltage, and the like. The scan line SL may extend in an x direction, and the data line DL and the driving voltage line PL may extend in a y direction.

The pixel PX may emit light of a luminance corresponding to an electrical signal from the pixel circuit that is electrically connected the pixel PX. The display area DA may display a certain image through the light emitted from the pixel PX. For reference, the pixel PX may be defined as a light-emitting area in which light of any one color of red, green, and blue is emitted, as described above.

The peripheral area PA is an area where no pixel PX is disposed and that does not display an image. AA power supply wiring for driving the pixel PX, and the like may be disposed in the peripheral area PA. Also, a pad PAD and the like, to which a printed circuit board including a driving circuit portion or an integrated circuit device such as a driver IC is electrically connected, may be disposed in the peripheral area PA.

In the following description, although an organic light-emitting display apparatus is described as an example of the display apparatus according to an embodiment, the display apparatus according to one or more embodiments is not limited thereto. As another embodiment, the display apparatus according to one or more embodiments may include a display apparatus, such as an inorganic light-emitting display apparatus (or inorganic electroluminescence (EL) display apparatus), a quantum dot light-emitting display apparatus, and the like. For example, an emission layer of a display element of a display apparatus may include an organic material or an inorganic material. Also, the display apparatus may include an emission layer and quantum dots located on a path of light emitted from the emission layer.

Figure 2:
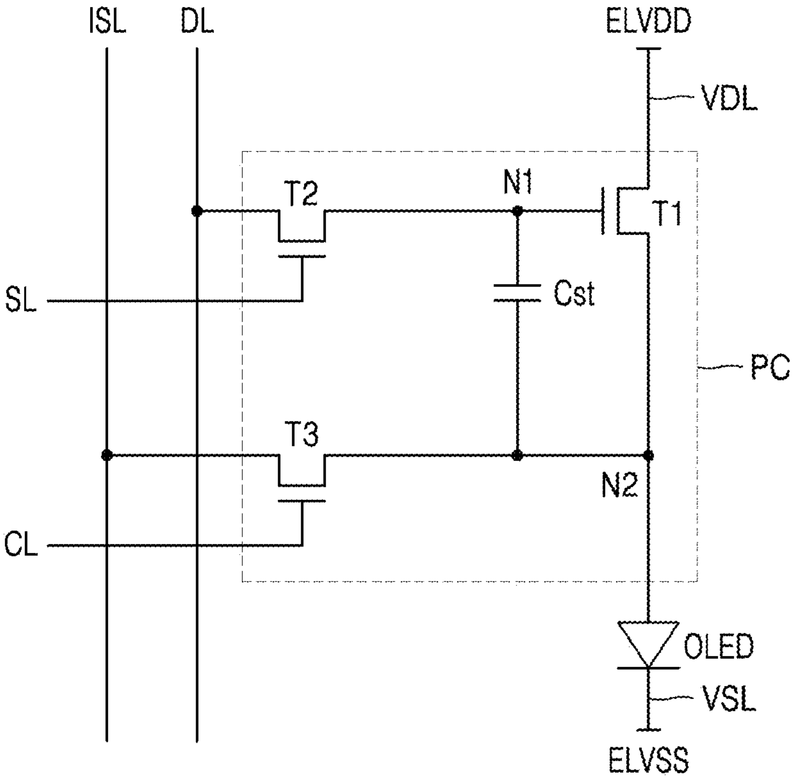
FIG. 2 is an equivalent circuit diagram of a pixel circuit electrically connected to a display element of a display apparatus according to an embodiment.

FIG. 2 is an equivalent circuit diagram of a pixel circuit electrically connected to a display element of a display apparatus according to an embodiment.

The display element may include an organic light-emitting diode OLED including an organic material. In another embodiment, the display element may be an inorganic light-emitting diode. The inorganic light-emitting diode may include a PN junction diode including materials based on an inorganic material semiconductor. When a voltage is applied to the PN junction diode in a forward direction, holes and electrons are injected, and energy generated by a recombination of the holes and the electrons is converted to light energy so that light of a certain color may be emitted. The inorganic light-emitting diode described above may have a width of several to several hundreds of micrometers or several to several hundreds of nanometers. In some embodiments, the display element may include a light-emitting diode including quantum dots. As described above, the emission layer of the display element may include an organic material, an inorganic material, quantum dots, an organic material and quantum dots, or an inorganic material and quantum dots. In the following description, it is assumed that the display element is an organic light-emitting diode OLED.

Referring to FIG. 2, a first electrode (e.g., anode) of a light-emitting diode, that is, an organic light-emitting diode OLED, may be connected to a pixel circuit PC, and a second electrode (e.g., cathode) of the organic light-emitting diode OLED may be connected to a common voltage line VSL for providing a common voltage ELVSS. The organic light-emitting diode OLED may emit light with a luminance corresponding to the amount of a current supplied from the pixel circuit PC.

The pixel circuit PC may control the amount of a current flowing, in response to a data signal, from a driving voltage ELVDD to the common voltage ELVSS via the organic light-emitting diode OLED. The pixel circuit PC may include a first thin film transistor T1, a second thin film transistor T2, a third thin film transistor T3, and a storage capacitor Cst.

Each of the first thin film transistor T1, the second thin film transistor T2, and the third thin film transistor T3 may be an oxide semiconductor transistor including a semiconductor layer formed of an oxide semiconductor, or a silicon semiconductor transistor including a semiconductor layer formed of polysilicon. Depending on the type of a transistor, the first electrode may be one of a source electrode and a drain electrode, and the second electrode may be the other of the source electrode and the drain electrode.

The first electrode of the first thin film transistor T1 may be connected to a driving voltage line VDL for supplying the driving voltage ELVDD, and the second electrode thereof may be connected to a first electrode of the organic light-emitting diode OLED. A gate electrode of the first thin film transistor T1 may be connected to a first node N1. The first thin film transistor T1 may control the amount of a current flowing from the driving voltage ELVDD to the organic light-emitting diode OLED, in response to the voltage of the first node N1.

The second thin film transistor T2 may be a switching transistor. A first electrode of the second thin film transistor T2 may be connected to the data line DL, and a second electrode thereof may be connected to the first node N1. A gate electrode of the second thin film transistor T2 may be connected to the scan line SL. The second thin film transistor T2 is turned on when a scan signal is supplied through the scan line SL and may electrically connect the data line DL with the first node N1.

The third thin film transistor T3 may be an initialization transistor or a sensing transistor. A first electrode of the third thin film transistor T3 may be connected to a second node N2, and a second electrode thereof may be connected to a sensing line ISL. A gate electrode of the third thin film transistor T3 may be connected to a control line CL.

The storage capacitor Cst may be connected between the first node N1 and the second node N2. For example, a first capacitor electrode of the storage capacitor Cst may be connected to the gate electrode of the first thin film transistor T1, and a second capacitor electrode of the storage capacitor Cst may be connected to the first electrode of the organic light-emitting diode OLED.

Although FIG. 2 illustrates that the first thin film transistor T1, the second thin film transistor T2, and the third thin film transistor T3 are n-channel metal oxide semiconductor (NMOS) transistors, the disclosure is not limited thereto. For example, at least one of the first thin film transistor T1, the second thin film transistor T2, and the third thin film transistor T3 may be formed as a p-channel metal oxide semiconductor (PMOS) transistor.

Although FIG. 2 illustrates three thin film transistors and one storage capacitor, the disclosure is not limited thereto. The pixel circuit PC may include four or more thin film transistors or two or more storage capacitors. In an embodiment, the pixel circuit PC may include seven thin film transistors and one storage capacitor.

Figure 3:
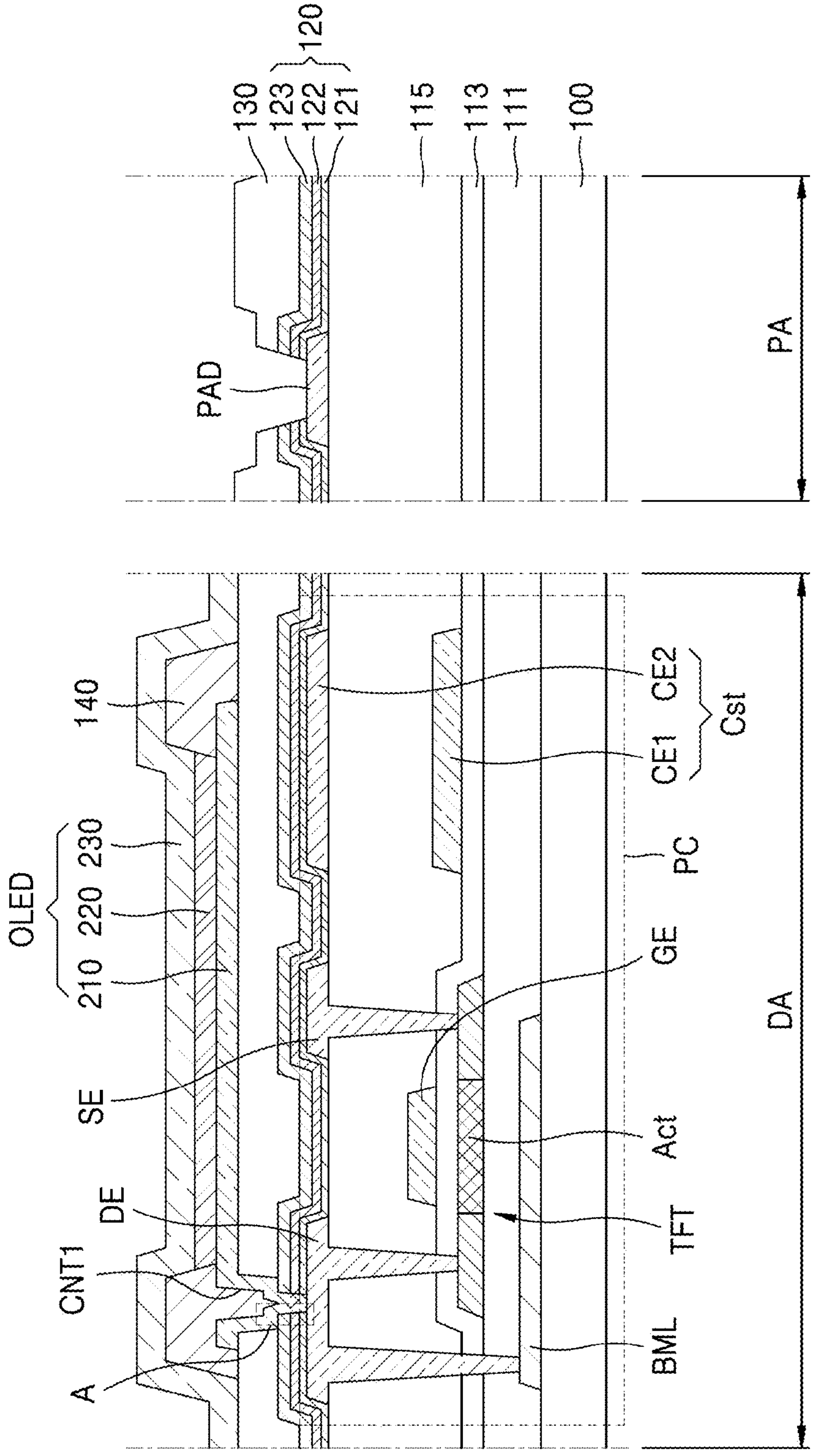
FIG. 3 is a schematic cross-sectional view of a display apparatus according to an embodiment.
Figure 4:
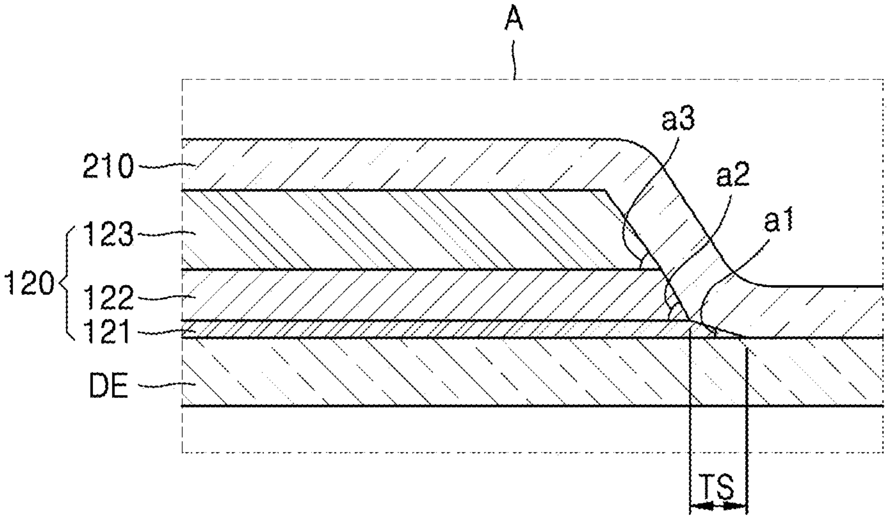
FIG. 4 is an enlarged cross-sectional view of a region A of FIG. 3.
Figure 5:
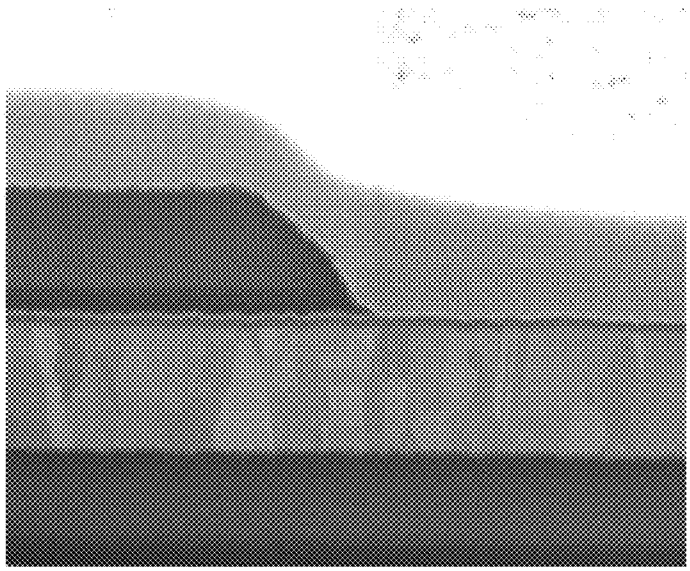
FIG. 5 is a scanning electron microscope (SEM) image of a portion of a display apparatus according to an embodiment.

FIG. 3 is a schematic cross-sectional view of a display apparatus according to an embodiment, and FIG. 4 is an enlarged cross-sectional view of a region A of FIG. 3. FIG. 5 is a SEM image of a portion of a display apparatus according to an embodiment.

As illustrated in FIG. 3, the display apparatus according to the present embodiment may include the substrate 100. The substrate 100 may include various materials that are flexible or bendable. For example, the substrate 100 may include glass, metal, or polymer resin. Furthermore, the substrate 100 may include polymer resin, such as polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 may be variously modified, for example, to have a multilayer structure including two layers including polymer resin as described above ad a barrier layer disposed between the layers and including an inorganic material, such as a silicon oxide, a silicon nitride, a silicon oxynitride, and the like.

A display element and a thin film transistor TFT electrically connected to the display element may be located on the substrate 100. FIG. 3 illustrates that, as the display element, the organic light-emitting diode OLED is disposed on the substrate 100. The organic light-emitting diode OLED being electrically connected to the thin film transistor TFT may be understood as a pixel electrode 210 of the organic light-emitting diode OLED is electrically connected to the thin film transistor TFT.

The pixel circuit PC may be disposed on the substrate 100. As the structure of the pixel circuit PC of each pixel PX is the same, one pixel circuit PC is mainly described. The pixel circuit PC may include a plurality of thin film transistors TFT and a storage capacitor Cst.

A buffer layer 111 including an inorganic material, such as a silicon oxide, a silicon nitride, a silicon oxynitride, or the like, may be disposed between the thin film transistor TFT and the substrate 100. The buffer layer 111 may be located below the pad PAD. The buffer layer 111 may increase smoothness of an upper surface of the substrate 100, or prevent or reduce infiltration of impurities from the substrate 100 and the like into a semiconductor layer Act of the thin film transistor TFT.

As illustrated in FIG. 3, the thin film transistor TFT may include the semiconductor layer Act including amorphous silicon, polycrystalline silicon, an organic semiconductor material, or an oxide semiconductor material. The thin film transistor TFT may include a gate electrode GE, a source electrode SE, and a drain electrode DE. The gate electrode GE may include various conductive materials and have various layered structures including, for example, a Mo layer and an Al layer. Alternately, the gate electrode GE may include a TiNx layer, an Al layer, or a Ti layer. The source electrode SE and the drain electrode DE may also include various conductive materials and have various layered structures including, for example, a Ti layer, an Al layer, or a Cu layer.

To secure insulation between the semiconductor layer Act and the gate electrode GE, a gate insulating layer 113 including an inorganic material, such as a silicon oxide, a silicon nitride, a silicon oxynitride, or the like, may be disposed between the semiconductor layer Act and the gate electrode GE. Although FIG. 3 illustrates that the gate insulating layer 113 has a shape corresponding to the entire surface of the substrate 100, and has a structure having contact holes formed in preset portions, the disclosure is not limited thereto. For example, the gate insulating layer 113 may be patterned in the same shape as the gate electrode GE.

Also, an interlayer insulating layer 115 including an inorganic material, such as a silicon oxide, a silicon nitride, a silicon oxynitride, or the like, may be disposed above the gate electrode GE. The interlayer insulating layer 115 may have a single layer or multilayer structure including the material described above. An insulating film including the inorganic material as above may be formed through chemical vapor deposition (CVD) or atomic layer deposition (ALD). This is the same as embodiments described below and modified examples thereof.

The storage capacitor Cst may include a first capacitor electrode CE1 and a second capacitor electrode CE2 that are overlapped with each other with the interlayer insulating layer 115 therebetween. The storage capacitor Cst may be disposed not to overlap the thin film transistor TFT. Although FIG. 3 illustrates that the gate electrode GE of the thin film transistor TFT is spaced apart from the first capacitor electrode CE1 of the storage capacitor Cst, the disclosure is not limited thereto. In another embodiment, the storage capacitor Cst may be disposed to overlap the thin film transistor TFT. For example, the gate electrode GE of the thin film transistor TFT may be the first capacitor electrode CE1 of the storage capacitor Cst. The first capacitor electrode CE1 of the storage capacitor Cst may include the same material as the gate electrode GE of the thin film transistor TFT. For example, the first capacitor electrode CE1 may include a conductive material including molybdenum (Mo), aluminum (Al), copper (Cu), titanium (Ti), and the like, and have a multilayer or single layer structure including the material described above.

The source electrode SE and the drain electrode DE may be disposed on the interlayer insulating layer 115. The second capacitor electrode CE2 of the storage capacitor Cst may be located on the same layer and formed of the same material as the source electrode SE and the drain electrode DE. The source electrode SE, the drain electrode DE, and the second capacitor electrode CE2 may include a highly conductive material. The source electrode SE, the drain electrode DE, and the second capacitor electrode CE2 may include a conductive material including Mo, Al, Cu, Ti, and the like, and may have a multilayer or single layer structure including the material described above. For example, the source electrode SE, the drain electrode DE, and the second capacitor electrode CE2 may have a multilayer structure of Ti/Al/Ti.

The disclosure is not limited thereto. For example, the thin film transistor TFT may include any one of the source electrode SE and the drain electrode DE, or include none of them. For example, one thin film transistor TFT does not include the drain electrode DE, another thin film transistor TFT connected to the one thin film transistor TFT does not include the source electrode SE, and the semiconductor layers Act of the two thin film transistors may be connected to each other. Such a connection structure may have the same effect as the structure in which one thin film transistor TFT includes the source electrode SE, another thin film transistor TFT includes the drain electrode DE, and the source electrode SE of the one thin film transistor TFT is connected to the drain electrode DE of the other thin film transistor TFT.

The pad PAD may be disposed in the peripheral area PA. The pad PAD may be disposed adjacent to any one of edges of the substrate 100. The pad PAD may be disposed on the interlayer insulating layer 115, and may be exposed without being covered by a passivation layer 120 and a planarization layer 130 described below. For example, the passivation layer 120 and the planarization layer 130 may include an opening portion that exposes a portion of the pad PAD, and the pad PAD may be electrically connected to a flexible printed circuit board through the opening portion. The pad PAD may be located on the same layer and formed of the same material as the source electrode SE and the drain electrode DE. In detail, the pad PAD may include a conductive material including Mo, Al, Cu, Ti, and the like, and have a multilayer or single layer structure including the material described above. For example, the pad PAD may have a multilayer structure of Ti/Al/Ti.

The passivation layer 120 may be disposed on the interlayer insulating layer 115, and may cover the thin film transistor TFT. The passivation layer 120 may serve as a protective/passivation film for protecting the thin film transistor TFT and the storage capacitor Cst. The passivation layer 120 may include a first passivation layer 121, a second passivation layer 122, and a third passivation layer 123. The passivation layer 120 is described below in detail with reference to FIGS. 4 and 5.

The planarization layer 130 may be disposed on the passivation layer 120. The planarization layer 130 may provide a flat upper surface for the organic light-emitting diode OLED disposed thereon. The planarization layer 130 and the passivation layer 120 may form a first contact hole CNT1 to connect the pixel electrode 210 of the organic light-emitting diode OLED with the drain electrode DE of the thin film transistor TFT. The planarization layer 130 may include an organic insulating material. For example, the planarization layer 130 may include photoresist, benzocyclobutene (BCB), polyimide, hexamethyldisiloxane (HMDSO), polymethylmethacrylate (PMMA), polystyrene, polymer derivatives having a phenolic group, acrylic polymer, imide-based polymer, aryl ether-based polymer, amide-based polymer, fluorine-based polymer, p-xylene-based polymer, vinyl alcohol-based polymer a mixture thereof, or the like. The planarization layer 130 may be provided as a single layer or multilayer including the material.

The organic light-emitting diode OLED may be disposed on the planarization layer 130. The organic light-emitting diode OLED may include the pixel electrode 210, an emission layer 220, and a counter electrode 230.

The pixel electrode 210, or a first electrode, may be connected to the drain electrode DE through the first contact hole CNT1 penetrating the passivation layer 120 and the planarization layer 130. The pixel electrode 210 may be a (semi-)transmissive electrode or a reflective electrode. In some embodiments, the pixel electrode 210 may include a reflective layer formed of Ag, Mg, Al, Pt, Pd, Au, Ni, Nd, Ir, Cr, and a compound thereof, and a transparent or semi-transparent electrode layer formed on the reflective layer. The pixel electrode 210 may include a transparent or semi-transparent electrode layer including an indium tin oxide (ITO), an indium zinc oxide (IZO), a zinc oxide (ZnO), an indium oxide ($In_2O_3$), an indium gallium oxide (IGO), or an aluminum zinc oxide (AZO). The pixel electrode 210 may be provided as a single film, a dual film, a triple film, or more.

A bank layer 140 may be disposed on the planarization layer 130. The bank layer 140 may cover an edge of the pixel electrode 210 and have an opening that exposes a portion of the pixel electrode 210. The bank layer 140 may prevent generation of arc and the like in the edge of the pixel electrode 210 by increasing a distance between the edge of the pixel electrode 210 and the counter electrode 230 above the pixel electrode 210.

The bank layer 140 may include one or more organic insulating materials selected from among polyimide, polyamide, acryl resin, benzocyclobutene, and phenol resin.

The emission layer 220 may be disposed on the pixel electrode 210. The emission layer 220 may overlap the opening of the bank layer 140. The emission layer 220 may include a low molecular weight or polymer material, and emit red, green, blue, or white light. In an embodiment, the emission layer 220 may be patterned to correspond to each of the pixel electrodes 210. In another embodiment, the emission layer 220 may be integrally formed across the pixel electrodes 210. A hole injection layer (HIL) or a hole transport layer (HTL) may be disposed between the pixel electrode 210 and the emission layer 220.

The counter electrode 230 (or a second electrode) may be disposed on the emission layer 220. The counter electrode 230 may include a conductive material having a low work function. For example, the counter electrode 230 may include a (semi-)transparent layer including silver (Ag), magnesium (Mg), Al, platinum (Pt), palladium (Pd), gold (Au), nickel (Ni), neodymium (Nd), iridium (Ir), chromium (Cr), lithium (Li), calcium (Ca), an alloy thereof, or the like. Alternatively, the counter electrode 230 may further include a layer such as ITO, IZO, ZnO, or $In_2O_3$ on the (semi-) transparent layer including the material described above. In an embodiment, the counter electrode 230 may be disposed to entirely cover the display area DA. An electron transport layer (ETL) or an electron injection layer (EIL) may be disposed between the emission layer 220 and the counter electrode 230.

Next, referring to FIG. 4, the passivation layer 120 may have a structure in which the first passivation layer 121, the second passivation layer 122, and the third passivation layer 123 are sequentially stacked. In other words, the first passivation layer 121 may be disposed on the interlayer insulating layer 115 to cover the source electrode SE and the drain electrode DE, and the second passivation layer 122 and the third passivation layer 123 may be disposed on the first passivation layer 121 and the second passivation layer 122, respectively.

The passivation layer 120 may include an inorganic insulating material including silicon. For example, the passivation layer 120 may include at least one of a silicon nitride (SiNx), a silicon oxide (SiOx), and a silicon oxynitride (SiON). In this state, the first passivation layer 121, the second passivation layer 122, and the third passivation layer 123 may include different materials. In an embodiment, the first passivation layer 121 may include a silicon ternary compound material consisting of essentially a silicon element and two or more different elements. The second passivation layer 122 and the third passivation layer 123 may each include a silicon compound material that includes a silicon element and one or more different element. However, although the silicon ternary compound material or the silicon compound material silicon element may refer to a material including additional different elements, they may include a very small amount of impurity elements.

In detail, the first passivation layer 121 may include SiON, and the second passivation layer 122 and the third passivation layer 123 may each include SiNx. However, the second passivation layer 122 and the third passivation layer 123 may each include SiNx having different physical properties according to different specific deposition conditions. In particular, as the first passivation layer 121 includes not only silicon (Si) and nitrogen (N) atoms, but also an oxygen (O) atom, an appropriate ratio of O to Si may be necessary considering the characteristics of the thin film transistor TFT disposed below the passivation layer 120. The ratio of O to Si included in the first passivation layer 121 may be 1.6:1 to 1.8:1.

However, as the passivation layer 120 described above is formed of SiNx, in a SiNx film deposition process, a large amount of hydrogen ions may be contained in the SiNx film. When the passivation layer 120 including a large amount of hydrogen ions is brought into contact with the thin film transistor TFT, the hydrogen ions diffuse into the thin film transistor TFT so that semiconductor characteristics may be deteriorated. To address the above issue, the passivation layer 120 according to one or more embodiments may have an amount of hydrogen of $1.0\times10^{21}$ atoms/$cm^3$ to $2.5\times10^{21}$ atoms/$cm^3$, which is detected by secondary ion mass spectrometry (SIMS). Alternatively, the passivation layer 120 may have a hydrogen ($H_2$) emission amount of $3.0\times10^{19}$ ea/$cm^2$ to $7.5\times10^{19}$ ea/$cm^2$, and an ammonia ($NH_3$) emission amount of $3.5\times10^{21}$ ea/$cm^2$ to $10.0\times10^{20}$ ea/$cm^2$, as measured by thermal desorption spectroscopy (TDS). As a result, compared with a case in which the passivation layer 120 is formed only SiNx, when the first passivation layer 121 is formed of SiON, a hydrogen containing amount in the layer is low, and thus, the deterioration of semiconductor characteristics due to the diffusion of hydrogen ions may be reduced.

Furthermore, as the first passivation layer 121, the second passivation layer 122, and the third passivation layer 123 are made of different materials, film stress to each of the first passivation layer 121, the second passivation layer 122, and the third passivation layer 123 may be different from one another. The film stress denotes a magnitude of a force of a thin film layer per unit area, and includes compressive stress or tensile stress. In the specification, the compressive stress is represented by a negative integer, and the tensile stress is represented by a positive integer. The compressive stress is a force in a direction to push a thin film, and may be a force in a direction in which a thin film is bent downward. In contrast, the tensile stress may be a force in a direction to pull a thin film, that is, in a direction in which a thin film is bent upward.

In an embodiment, the compressive stress of the first passivation layer 121 may be less than the compressive stress of the compressive stress of the second passivation layer 122 and the third passivation layer 123. For example, the compressive stress of the first passivation layer 121 may be −40 Mpa to −52 Mpa, the compressive stress of the second passivation layer 122 may be −270 Mpa to −340 Mpa, and the compressive stress of the third passivation layer 123 may be −130 Mpa to −170 Mpa. In other words, the first passivation layer 121 is a film having stress greater than the second passivation layer 122 and the third passivation layer 123, and may function to compensate for the compressive stress of the second passivation layer 122 and the third passivation layer 123.

The passivation layer 120 may become strong against external impacts or bending by including SiON in the first passivation layer 121. Furthermore, by not including SiON in the second passivation layer 122 and the third passivation layer 123, a film stress difference between a layer disposed below the passivation layer 120 and the passivation layer 120 may be reduced. Accordingly, a layer lifting defect that may occur between the layer disposed below the passivation layer 120 and the passivation layer 120 may be prevented.

In the related art, to prevent a layer lifting or layer delamination defect occurring between the lower layer of the passivation layer 120 and the passivation layer 120, it is essential to perform a stabilization process after the deposition of the passivation layer 120. However, when the first passivation layer 121 including SiON is included as a lower layer, an inter-film stress difference is compensated, and thus, there is no need to perform an additional stabilization process. Accordingly, when the passivation layer 120 according to an embodiment is applied to the display panel 10, a stabilization time after the deposition of the passivation layer 120 may be omitted, and thus, a process time (takt time) may be reduced while mass productivity is improved.

The first passivation layer 121, the second passivation layer 122, and the third passivation layer 123 described above may be disposed with different thicknesses. The second passivation layer 122 may have a thickness greater than the first passivation layer 121, and the third passivation layer 123 may have a thickness greater than the second passivation layer 122. In an embodiment, the thickness of the first passivation layer 121 may be 0.10 to 0.25 times greater than the sum of the thickness of the second passivation layer 122 and the thickness of the third passivation layer 123. For example, when the third passivation layer 123 has a thickness of about 3000 Å, the thickness of the first passivation layer 121 may be 300 Å to 1000 Å, and the thickness of the second passivation layer 122 may be 1000 Å to 1700 Å.

In Table 1 provided as FIG. 8, layer lifting defect test results for Comparative Example 1, Comparative Example 2, Embodiment 1, Embodiment 2, and Embodiment 3 are compared and shown.

The display panel 10 of Comparative Example 1 does not include the first passivation layer 121, and include only the second passivation layer 122 and the third passivation layer 123, and thus, the passivation layer 120 is manufactured to have a dual layer structure. In this state, while the second passivation layer 122 and the third passivation layer 123 include SiNx, the second passivation layer 122 and the third passivation layer 123 are manufactured to have different specific deposition conditions and physical properties. The second passivation layer 122 is formed with a thickness of 2000 Å, and the third passivation layer 123 is formed with a thickness of 3000 Å.

The display panel 10 of Comparative Example 2 includes all of the first passivation layer 121, the second passivation layer 122, and the third passivation layer 123, and thus, the passivation layer 120 is manufactured to have a triple layer structure. In this state, the first passivation layer 121, the second passivation layer 122, and the third passivation layer 123 are all include SiNx, but the first passivation layer 121, the second passivation layer 122, and the third passivation layer 123 are manufactured to have different specific deposition conditions and physical properties. The first passivation layer 121 is formed with a thickness of 500 Å, the second passivation layer 122 is formed with a thickness of 1500 Å, and the third passivation layer 123 is formed with a thickness of 3000 Å.

The display panel 10 of Embodiment 1 includes all of the first passivation layer 121, the second passivation layer 122, and the third passivation layer 123, and thus, the passivation layer 120 is manufactured to have a triple layer structure. In this state, while the first passivation layer 121 includes SiON and the second passivation layer 122 and the third passivation layer 123 include SiNx, the second passivation layer 122 and the third passivation layer 123 are manufactured to have different specific deposition conditions and physical properties. The first passivation layer 121 is formed with a thickness of 300 Å, the second passivation layer 122 is formed with a thickness of 1700 Å, and the third passivation layer 123 is formed with a thickness of 3000 Å.

In the display panel 10 of Embodiment 2, the first passivation layer 121, the second passivation layer 122, and the third passivation layer 123 are respectively deposited to include the same material as Embodiment 1. However, the first passivation layer 121 is formed with a thickness of 500 Å, the second passivation layer 122 is formed with a thickness of 1500 Å, and the third passivation layer 123 is formed with a thickness of 3000 Å.

In the display panel 10 of Embodiment 3, the second passivation layer 122, and the third passivation layer 123 are respectively deposited to include the same material as Embodiment 1, the first passivation layer 121. However, the first passivation layer 121 is formed with a thickness of 1000 Å, the second passivation layer 122 is formed with a thickness of 1000 Å, and the third passivation layer 123 is formed with a thickness of 3000 Å.

For the comparative examples and embodiments, 20 display panels are each manufactured in the same conditions. An average lifting defect rate generated per display panel is calculated by counting the number of portions where layer lifting occurs between the passivation layer 120 and the lower layer of the passivation layer 120 of each display panel, and then dividing the counted number by the number of panels.

Referring to Table 1 (FIG. 8), the average lifting defect rate of Comparative Example 1 employing the passivation layer 120 having a dual layer structure of SiNx/SiNx is 19.5/glass, which shows a high defect rate. The average lifting defect rate of Comparative Example 2 employing the passivation layer 120 including a triple layer structure of SiNx/SiNx/SiNx is 5.80/glass, which is better than Comparative Example 1 but still shows a high defect rate. The average lifting defect rates of Embodiment 1 to Embodiment 3 employing the passivation layer 120 having a triple layer structure of SiON/SiNx/SiNx are 0.60/glass, 0.02/glass, and 0.00/glass, respectively, which shows that the film lifting defect hardly occurs.

It may be checked through the result of Table 1 that, when the passivation layer 120 has a triple layer structure, not a dual layer, it is more advantageous to the layer lifting defect. In particular, when the first passivation layer 121 that is disposed in the lowermost layer of the triple layer structure includes SiON, it may be seen that, compared with a case in which the lower layer is formed of SiNx, the defect rate is greatly improved. This means, as described above, that, when the first passivation layer 121 includes SiON, the first passivation layer 121 may compensate for the compressive stress of the second passivation layer 122 and the third passivation layer 123, and the film stress difference from the lower layer of the passivation layer 120 may be reduced.

Furthermore, referring to FIGS. 3 and 4, with the planarization layer 130, the passivation layer 120 may include the first contact hole CNT1 that may connect the pixel electrode 210 with the drain electrode DE. The first contact hole CNT1 may penetrate all of the first passivation layer 121, the second passivation layer 122, and the third passivation layer 123.

The first contact hole CNT1 formed in the passivation layer 120 and the planarization layer 130 may be formed through a dry etching process. However, as each of the first passivation layer 121, the second passivation layer 122, and the third passivation layer 123 includes different compositions, the physical properties thereof are different from one another so that, even when the dry etching process is performed under the same condition, a degree of etching of each layer may vary. In other words, SiNx included in the second passivation layer 122 and the third passivation layer 123 may have a greater etch rate than SiON included in the first passivation layer 121.

Accordingly, angles formed between side surfaces of the first passivation layer 121, the second passivation layer 122, and the third passivation layer 123, at a side of the first contact hole CNT1, and a lower surface of the passivation layer 120 may be different from one another. In detail, a first angle $\alpha 1$ formed between the side surface of the first passivation layer 121 facing the first contact hole CNT1 and the lower surface of the passivation layer 120 may be less than each of a second angle $\alpha 2$ formed between the side surface of the second passivation layer 122 facing the first contact hole CNT1 and the lower surface of the passivation layer 120 and a third angle $\alpha 3$ formed between the side surface of the third passivation layer 123 facing the first contact hole CNT1 and the lower surface of the passivation layer 120. In an embodiment, the first angle $\alpha 1$ of the first passivation layer 121 may be 20° to 30°, and the second angle $\alpha 2$ of the second passivation layer 122 may be 50° to 60°, and the third angle $\alpha 3$ of the third passivation layer 123 may be 40° to 50°.

Furthermore, as the etch rates of the first passivation layer 121, the second passivation layer 122, and the third passivation layer 123 are different from one another, degrees of protruding of the first passivation layer 121, the second passivation layer 122, and the third passivation layer 123 may be different from one another. In detail, a lower surface of the first passivation layer 121 may protrude toward the center of the first contact hole CNT1 further than a lower surface of the second passivation layer 122 and a lower surface of the third passivation layer 123. In an embodiment, a length TS of the lower surface of the first passivation layer 121 protruding toward the center of the first contact hole CNT1 further than the lower surface of the second passivation layer 122 may be 0.1 μm to 0.2 μm.

As a result, as illustrated in FIGS. 4 and 5, the first passivation layer 121 may include a portion, that is, a tail region, protruding toward the first contact hole CNT1 further than the second passivation layer 122 and the third passivation layer 123. Furthermore, the side surface of the first passivation layer 121 facing the first contact hole CNT1 may be formed more gently than the side surface of the second passivation layer 122 facing the first contact hole CNT1 and the side surface of the third passivation layer 123 facing the first contact hole CNT1.

The pixel electrode 210 disposed on the passivation layer 120 including the first passivation layer 121, the second passivation layer 122, and the third passivation layer 123 as described above may be deposited to be flat and smooth. When only the second passivation layer 122 and the third passivation layer 123 including SiNx are disposed, due to the absence of the first passivation layer 121 functioning as a bridge, a steep step may be formed in the area of the first contact hole CNT1 between the lower surface of the passivation layer 120 and the passivation layer 120. Accordingly, when the pixel electrode 210 is deposited in the area of the first contact hole CNT1, the step coverage of the pixel electrode 210 becomes irregular. For example, when the pixel electrode 210 has a structure of ITO/Ag/ITO, there may be a defect that Ag of the pixel electrode 210 is eluted at a position close to an interface between the passivation layer 120 and the lower layer of the passivation layer 120. However, like the passivation layer 120 according to an embodiment, when the first passivation layer 121 including SiON having a different etch rate is included, the inclination of the side surface of the first passivation layer 121 is gentle, and the first passivation layer 121 includes a tail region, the step of the passivation layer 120 and the lower layer thereof become better. As a result, as the step coverage of the pixel electrode 210 formed in the area of the first contact hole CNT1 is improved, an effect of preventing the Ag elution defect may be implemented.

Figure 6:
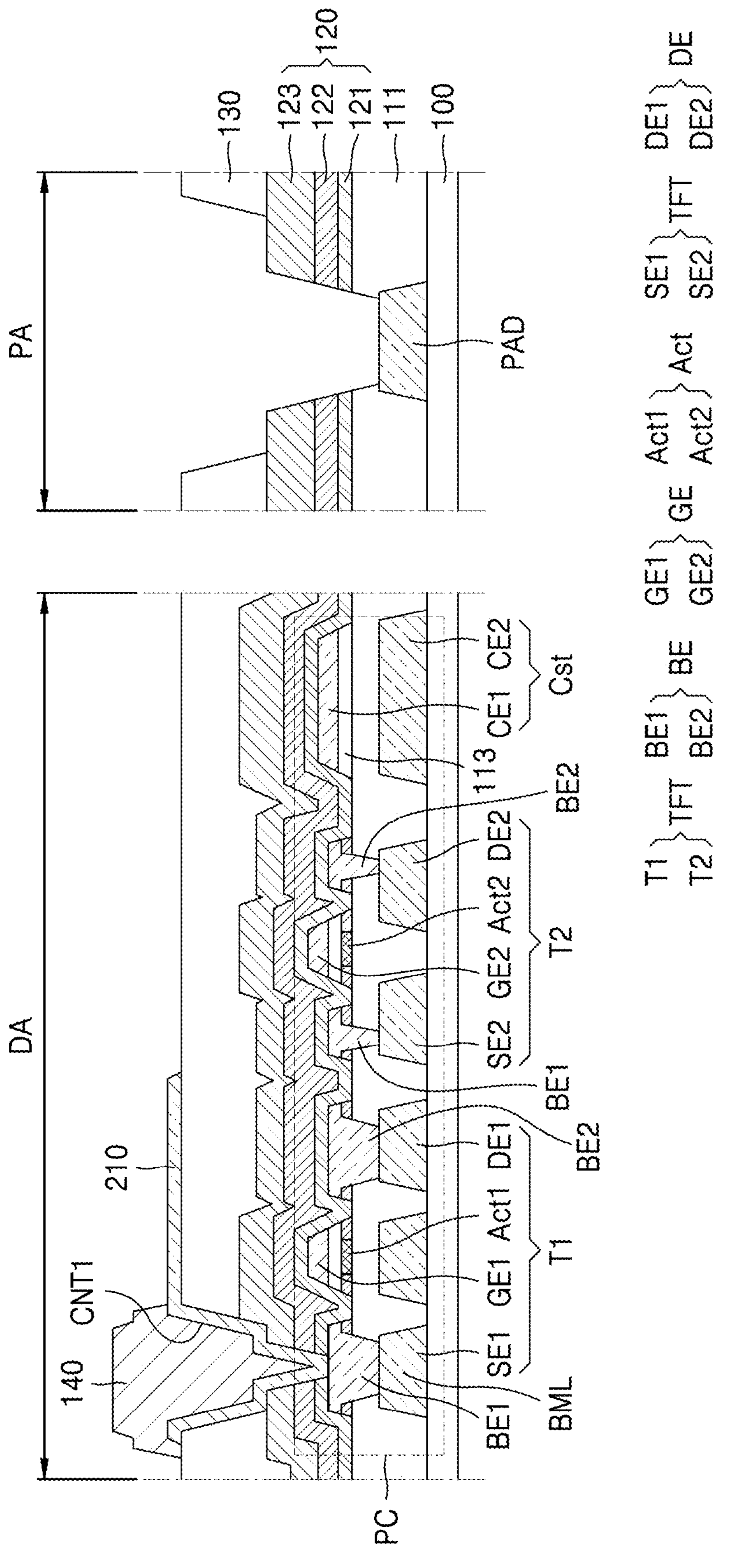
FIG. 6 is a schematic cross-sectional view of a display apparatus according to another embodiment.

FIG. 6 is a schematic cross-sectional view of a display apparatus according to another embodiment. Referring to FIG. 6, except the characteristics of the pixel circuit PC, other characteristics are the same as those described in FIGS. 3 and 4. The reference numerals of the constituent elements of FIG. 6 are replaced with those of the constituent elements described above with reference to FIGS. 3 and 4, and the following description focuses on differences only.

Referring to FIG. 6, the pixel circuit PC disposed on the substrate 100 may include the first thin film transistor T1, the second thin film transistor T2, and the storage capacitor Cst. The first thin film transistor T1 and the second thin film transistor T2 may have the same structure.

The thin film transistor TFT may include the semiconductor layer Act, the gate electrode GE overlapping a channel region of the semiconductor layer Act, the source electrode SE, and the drain electrode DE. The gate insulating layer 113 may be provided between the semiconductor layer Act and the gate electrode GE.

A bottom metal layer BML may be disposed below the semiconductor layer Act. The bottom metal layer BML is disposed between the substrate 100 and the buffer layer 111, and covered by the buffer layer 111. The bottom metal layer BML may include Al, Pt, Pd, Ag, Mg, Au, Ni, Nd, Ir, Cr, Ni, Ca, Mo, Ti, tungsten (W), or Cu, and have a single layer or multilayer structure including the material described above.

The bottom metal layer BML may include the source electrode SE and the drain electrode DE of the thin film transistor TFT. Accordingly, the source electrode SE and the drain electrode DE may be located on the same layer, and disposed below the semiconductor layer Act.

A bridge electrode BE may be disposed on the same layer and formed of the same material as the gate electrode GE. The bridge electrode BE may electrically connect the semiconductor layer Act with the bottom metal layer BML. In detail, the bridge electrode BE may include a first bridge electrode BE1 for electrically connecting the source electrode SE with source region of the semiconductor layer Act and a second bridge electrode BE2 for electrically connecting the drain electrode DE with a drain region of the semiconductor layer Act.

The passivation layer 120 may be disposed on the gate electrode GE and the bridge electrode BE. The passivation layer 120 may serve as a protective/passivation film for protecting the thin film transistor TFT and the storage capacitor Cst. The passivation layer 120 may include the first passivation layer 121, the second passivation layer 122, and the third passivation layer 123.

As described above in FIG. 3, the passivation layer 120 may have a structure in which the first passivation layer 121, the second passivation layer 122, and the third passivation layer 123 are sequentially stacked. The first passivation layer 121 may include SiON, and the second passivation layer 122 and the third passivation layer 123 may each include SiNx. However, the second passivation layer 122 and the third passivation layer 123 may each include SiNx having different physical properties due to different specific deposition conditions.

As a result, even in a display apparatus having the pixel circuit PC structure of FIG. 6, as the first passivation layer 121 including SiON is disposed in the lowermost portion of the passivation layer 120, the film stress difference between the layer disposed in the bottom of the passivation layer 120 and the passivation layer 120 may be reduced. Accordingly, the layer lifting defect that may occur between the lower layer of the passivation layer 120 and the passivation layer 120 may also be prevented. Furthermore, the stabilization time after the deposition of the passivation layer 120 may be omitted due to the first passivation layer 121 including SiON, and thus, a process time (takt time) may be reduced while mass productivity is improved.

Furthermore, when the display apparatus according to another embodiment of FIG. 6 includes the first passivation layer 121 including SiON having a different etch rate, as the inclination of the side surface of the first passivation layer 121 is gentle and the first passivation layer 121 includes a tail region, the step of the passivation layer 120 and the lower layer thereof may become better. As a result, as the step coverage of the pixel electrode 210 formed in the area of the first contact hole CNT1 is improved, the effect of preventing the Ag elution defect may be implemented.

Figure 7:
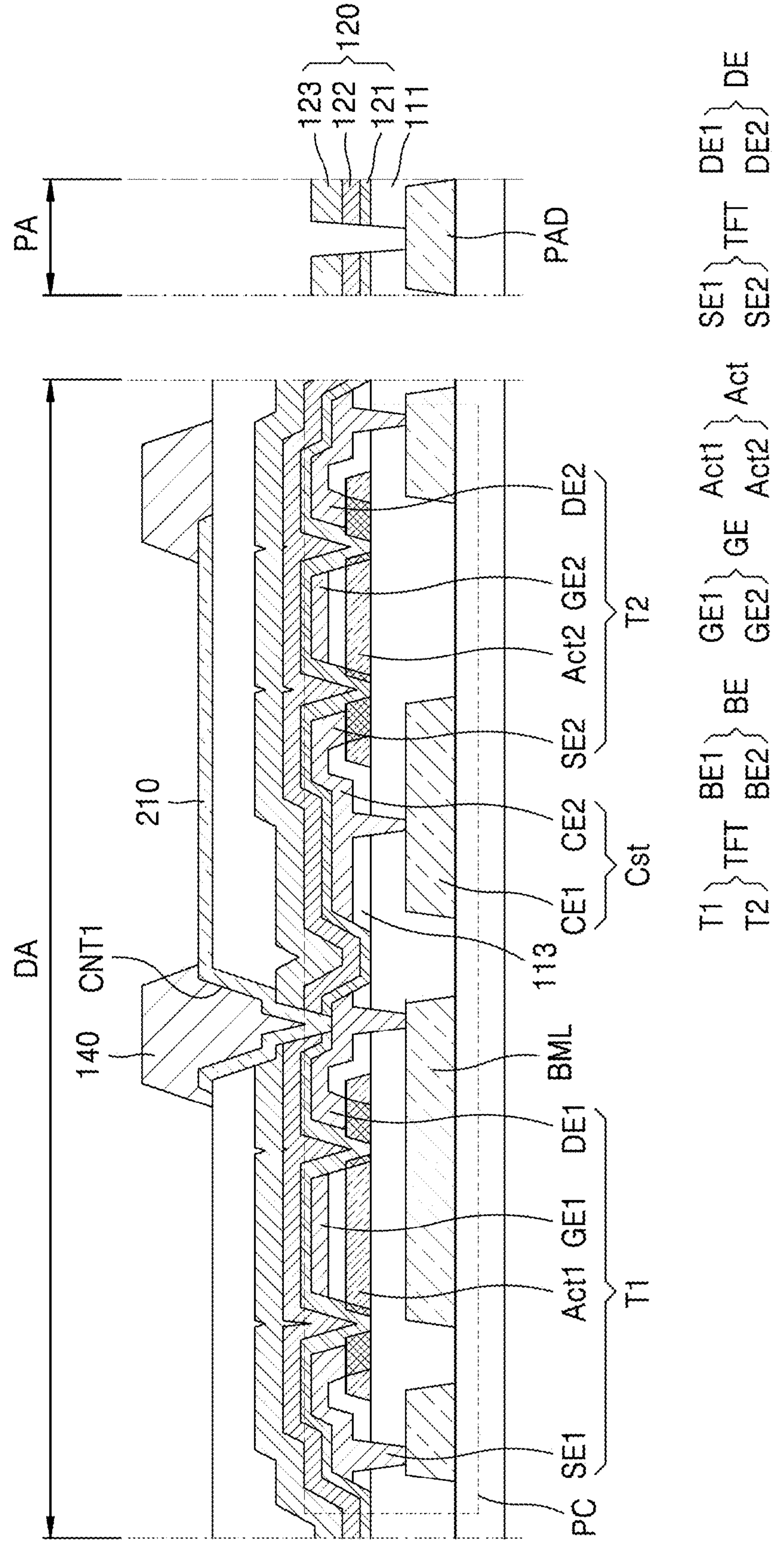
FIG. 7 is a schematic cross-sectional view of a display apparatus according to another embodiment.

FIG. 7 is a schematic cross-sectional view of a display apparatus according to another embodiment. Referring to FIG. 7, except the characteristics of the pixel circuit PC, other characteristics are the same as those described in FIGS. 3 and 4. The reference numerals of the constituent elements of FIG. 7 are replaced with those of the constituent elements described above with reference to FIGS. 3 and 4, and the following description focuses on differences only.

Referring to FIG. 7, the pixel circuit PC disposed on the substrate 100 may include the first thin film transistor T1, the second thin film transistor T2, and the storage capacitor Cst. The first thin film transistor T1 and the second thin film transistor T2 may have the same structure.

The thin film transistor TFT may include the semiconductor layer Act, the gate electrode GE, the source electrode SE, and the drain electrode DE. The storage capacitor Cst may include the first capacitor electrode CE1 and the second capacitor electrode CE2.

The bottom metal layer BML may be disposed between the substrate 100 and the buffer layer 111. The bottom metal layer BML may include the first capacitor electrode CE1 of the storage capacitor Cst. The bottom metal layer BML may include at least one conductive material including Mo, Al, Cu, Ti, and the like, and have a single layer or multilayer structure including the material described above.

The semiconductor layer Act may be disposed on the buffer layer 111. The semiconductor layer Act may be disposed to overlap the bottom metal layer BML. The semiconductor layer Act may include a channel region, and a source region and a drain region disposed on both sides of the channel region.

The gate insulating layer 113 may be disposed on the semiconductor layer Act, and the gate insulating layer 113 may be patterned to partially overlap the semiconductor layer Act, or cover an end of the semiconductor layer Act. In the semiconductor layer Act, an area that is exposed without overlapping the gate insulating layer 113 may become conductive by plasma processing and the like. In another embodiment, the gate insulating layer 113 may be disposed on the entire surface of the substrate 100 to cover the semiconductor layer Act, not patterned to partially overlap the semiconductor layer Act.

The gate electrode GE may be disposed on the gate insulating layer 113 to overlap the channel region of the semiconductor layer Act. The second capacitor electrode CE2 of the storage capacitor Cst, the source electrode SE, and the drain electrode DE may be disposed on the same layer and formed of the same material as the gate electrode GE. The gate electrode GE, the second capacitor electrode CE2, the source electrode SE, and the drain electrode DE may each include at least one conductive material including Mo, Al, Cu, Ti, and the like, and have a multilayer or single layer structure including the material described above.

The passivation layer 120 may be disposed on the gate electrode GE, the source electrode SE, the drain electrode DE, and the second capacitor electrode CE2. The passivation layer 120 may serve as a protective/passivation film for protecting the thin film transistor TFT and the storage capacitor Cst. The passivation layer 120 may include the first passivation layer 121, the second passivation layer 122, and the third passivation layer 123.

As described above in FIG. 3, the passivation layer 120 may have a structure in which the first passivation layer 121, the second passivation layer 122, and the third passivation layer 123 are sequentially stacked. The first passivation layer 121 may include SiON, and the second passivation layer 122 and the third passivation layer 123 may include SiNx. However, the second passivation layer 122 and the third passivation layer 123 may each include SiNx having different physical properties due to different specific deposition conditions.

As a result, even in a display apparatus having the pixel circuit PC structure of FIG. 7, as the first passivation layer 121 including SiON is disposed in the lowermost portion of the passivation layer 120, the film stress difference between the layer disposed in the bottom of the passivation layer 120 and the passivation layer 120 may be reduced. Accordingly, the layer lifting defect that may occur between the lower layer of the passivation layer 120 and the passivation layer 120 may also be prevented. Furthermore, the stabilization time after the deposition of the passivation layer 120 may be omitted due to the first passivation layer 121 including SiON, and thus, a process time (takt time) may be reduced while mass productivity is improved.

Furthermore, when the display apparatus according to another embodiment of FIG. 7 includes the first passivation layer 121 including SiON having a different etch rate, as the inclination of the side surface of the first passivation layer 121 is gentle and the first passivation layer 121 includes a tail region, the step of the passivation layer 120 and the lower layer thereof may become better. As a result, as the step coverage of the pixel electrode 210 formed in the area of the first contact hole CNT1 is improved, the effect of preventing the Ag elution defect may be implemented.

According to the display apparatus according to an embodiment configured as described above, yield may be improved by preventing the layer lifting and the layer delamination defect may be prevented and improving the step coverage. Furthermore, as an additional stabilization process may be omitted, it may be advantageous in terms of productivity. The effect described above is an example, and the scope of the disclosure is not limited by the effect.

It should be understood that embodiments described herein should be considered in a descriptive sense only and not for purposes of limitation. Descriptions of features or aspects within each embodiment should typically be considered as available for other similar features or aspects in other embodiments. While embodiments have been described with reference to the figures, it will be understood by those of ordinary skill in the art that various changes in form and details may be made therein without departing from the scope and spirit as defined by the following claims.

What is claimed is:

1. A display apparatus comprising:

a thin-film transistor including a semiconductor layer, a gate electrode, and an electrode;

an organic light-emitting element electrically connected to the thin-film transistor and including a first electrode, an emission layer, and a second electrode; and a passivation layer covering the electrode of the thin-film transistor and including a first contact hole connecting the electrode with the first electrode, wherein the semiconductor layer includes a channel region, and a source region and a drain region on both sides of the channel region, the gate electrode overlaps the channel region, and the electrode is electrically connected to the source region or the drain region, the passivation layer includes a first passivation layer, a second passivation layer, and a third passivation layer, which are sequentially stacked, the first passivation layer includes SiON, and a first angle formed between a side surface of the first passivation layer facing the first contact hole and a lower surface of the passivation layer is less than each of a second angle formed between a side surface of the second passivation layer facing the first contact hole and the lower surface of the passivation layer and a third angle formed between a side surface of the third passivation layer facing the first contact hole and the lower surface of the passivation layer.

2. The display apparatus of claim 1, wherein each of the second passivation layer and the third passivation layer includes SiNx.

3. The display apparatus of claim 1, wherein the first angle is 20° to 30°, the second angle is 50° to 60°, and the third angle is 40° to 50°.

4. The display apparatus of claim 1, wherein a lower surface of the first passivation layer protrudes toward a center of the first contact hole further than a lower surface of the second passivation layer and a lower surface of the third passivation layer do.

5. The display apparatus of claim 4, wherein a length of the lower surface of the first passivation layer protruding toward the center of the first contact hole further than the lower surface of the second passivation layer is 0.1 μm to 0.2 μm.

6. The display apparatus of claim 1, wherein a thickness of the first passivation layer is 0.10 to 0.25 times a sum of a thickness of the second passivation layer and a thickness of the third passivation layer.

7. The display apparatus of claim 6, wherein a thickness of the first passivation layer is 300 Å to 1000 Å, and a thickness of the second passivation layer is 1000 Å to 1700 Å.

8. The display apparatus of claim 1, wherein a ratio of oxygen (O) to silicon (Si) included in the first passivation layer is 1.6:1 to 1.8:1.

9. The display apparatus of claim 1, wherein an amount of hydrogen included in the passivation layer, as detected by secondary ion mass spectrometry (SIMS), is $1.0\times10^{21}$ atoms/$cm^3$ to $2.5\times10^{21}$ atoms/$cm^3$.

10. The display apparatus of claim 1, wherein the passivation layer has a hydrogen ($H_2$) emission amount of $3.0\times10^{19}$ ea/$cm^2$ to $7.5\times10^{19}$ ea/$cm^2$, and an ammonia ($NH_3$) emission amount of $3.5\times10^{20}$ ea/$cm^2$ to $10.0\times10^{20}$ ea/$cm^2$, as measured by thermal desorption spectroscopy (TDS).

11. The display apparatus of claim 1, wherein a compressive stress of the first passivation layer is less than a compressive stress of the second passivation layer and compressive stress of the third passivation layer.

12. The display apparatus of claim 11, wherein the compressive stress of the first passivation layer is 40 Mpa to 52 Mpa, the compressive stress of the second passivation layer is −270 Mpa to −340 Mpa, and the compressive stress of the third passivation layer is −130 Mpa to −170 Mpa.

13. A display apparatus comprising:

a substrate;

a buffer layer disposed on the substrate;

an active layer disposed on the buffer layer;

a gate insulating layer disposed on the active layer;

a gate electrode disposed on the gate insulating layer;

an interlayer insulating layer disposed on the gate electrode;

an electrode disposed on the interlayer insulating layer and electrically connected to the active layer; and a passivation layer disposed on the electrode, wherein the passivation layer includes a first passivation layer, a second passivation layer, and a third passivation layer, the first passivation layer includes a material consisting of essentially a silicon element and two or more different elements, and each of the second passivation layer and the third passivation layer includes a material consisting of essentially a silicon element and one or more different elements, and the first passivation layer has less compressive stress than the second passivation layer and the third passivation layer, and the third passivation layer has less compressive stress than the second passivation layer.

14. The display apparatus of claim 13, wherein the first passivation layer includes SiON, and each of the second passivation layer and the third passivation layer includes SiNx.

15. The display apparatus of claim 13, wherein compressive stress of the first passivation layer is −40 Mpa to −52 Mpa, compressive stress of the second passivation layer is −270 Mpa to −340 Mpa, and compressive stress of the third passivation layer is −130 Mpa to −170 Mpa.

16. The display apparatus of claim 13, further comprising:

a planarization layer disposed on the passivation layer; and an organic light-emitting element disposed on the planarization layer and including a first electrode, an emission layer, and a second electrode, wherein the passivation layer and the planarization layer includes a first contact hole connecting the first electrode with the electrode, and a first angle formed between a side surface of the first passivation layer facing the first contact hole and a lower surface of the passivation layer is less than each of a second angle formed between a side surface of the second passivation layer facing the first contact hole and the lower surface of the passivation layer and a third angle formed between a side surface of the third passivation layer facing the first contact hole and the lower surface of the passivation layer.

17. The display apparatus of claim 16, wherein the first angle is 20° to 30°, the second angle is 50° to 60°, and the third angle is 40° to 50°.

18. The display apparatus of claim 16, wherein a lower surface of the first passivation layer protrudes toward a center of the first contact hole further than a lower surface of the second passivation layer and a lower surface of the third passivation layer do.

19. The display apparatus of claim 18, wherein a length of the lower surface of the first passivation layer protruding toward the center of the first contact hole further than the lower surface of the second passivation layer is 0.1 μm to 0.2 μm.

20. The display apparatus of claim 13, wherein a thickness of the first passivation layer is 0.10 to 0.25 times a sum of a thickness of the second passivation layer and a thickness of the third passivation layer.

21. The display apparatus of claim 20, wherein a thickness of the first passivation layer is 300 Å to 1000 Å, and a thickness of the second passivation layer is 1000 Å to 1700 Å.

22. The display apparatus of claim 13, wherein a ratio of oxygen (O) to silicon (Si) included in the first passivation layer is 1.6:1 to 1.8:1.

23. The display apparatus of claim 13, wherein an amount of hydrogen included in the passivation layer, as detected by secondary ion mass spectrometry (SIMS), is $1.0\times10^{21}$ atoms/$cm^3$ to $2.5\times10^{21}$ atoms/$cm^3$.

24. The display apparatus of claim 13, wherein the passivation layer has a hydrogen ($H_2$) emission amount of $3.0\times10^{19}$ ea/cm$^2$ to $7.5\times10^{19}$ ea/cm$^2$, and an ammonia ($NH_3$) emission amount of $3.5\times10^{20}$ ea/cm$^2$ to $10.0\times10^{20}$ ea/cm$^2$, as measured by thermal desorption spectroscopy (TDS).

* * * * *